US 012309228B2

(12) United States Patent
Kleeberger et al.

(10) Patent No.: US 12,309,228 B2
(45) Date of Patent: May 20, 2025

(54) SECURITY AND RELIABILITY DETECTION FOR A SENSOR COMMUNICATION CHANNEL

(71) Applicant: Infineon Technologies AG, Neubiberg (DE)

(72) Inventors: Veit Kleeberger, Munich (DE); Rafael Zalman, Markt Schwaben (DE); Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 18/047,491

(22) Filed: Oct. 18, 2022

(65) Prior Publication Data

US 2024/0129367 A1    Apr. 18, 2024

(51) Int. Cl.
*H04L 67/12* (2022.01)
*G01R 31/52* (2020.01)
*G01R 31/56* (2020.01)
*H04L 41/06* (2022.01)

(52) U.S. Cl.
CPC .............. *H04L 67/12* (2013.01); *G01R 31/52* (2020.01); *G01R 31/56* (2020.01); *H04L 41/06* (2013.01)

(58) Field of Classification Search
CPC ......... H04L 67/12; H04L 41/06; G01R 31/52; G01R 31/56
See application file for complete search history.

(56) References Cited

U.S. PATENT DOCUMENTS

| 2002/0140433 | A1* | 10/2002 | Lawson | ................. | G01R 27/18 324/509 |
| 2007/0230756 | A1* | 10/2007 | Wen | ..................... | G01S 7/52034 382/128 |
| 2009/0310716 | A1* | 12/2009 | Yang | ..................... | H04L 25/061 375/340 |
| 2013/0035901 | A1* | 2/2013 | Breed | ................. | G08B 21/0286 702/188 |

(Continued)

OTHER PUBLICATIONS

Mostafa et al., "Physical Unclonable Function and Hashing Are All You Need to Mutually Authenticate IoT Devices," Sensors 2020, 20(16), 4361, 21 pages.

(Continued)

*Primary Examiner* — Akm Zakaria
(74) *Attorney, Agent, or Firm* — Harrity & Harrity, LLP (57) ABSTRACT

A monitoring system includes: a sensor configured to generate a sensor signal based on a measured property; a controller configured to communicate with the sensor; and a communication channel electrically coupled to the sensor and the controller for carrying electrical communications therebetween. The sensor includes a transmitter configured to transmit an electrical signal on the communication channel to the controller. The controller includes a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold.

22 Claims, 3 Drawing Sheets

(56) References Cited

U.S. PATENT DOCUMENTS

| | | | | |
|---|---|---|---|---|
| 2015/0122018 A1* | 5/2015 | Yuen | .................... | A61B 5/4812 |
| | | | | 73/514.01 |
| 2015/0180596 A1* | 6/2015 | Berg | ................... | H04L 27/2601 |
| | | | | 375/224 |
| 2018/0270196 A1* | 9/2018 | Bathurst | ............. | H04L 63/1416 |
| 2022/0324434 A1* | 10/2022 | Erlenbeck | ............... | H04L 12/40 |
| 2022/0365210 A1* | 11/2022 | Lind | ....................... | G01S 15/42 |

OTHER PUBLICATIONS

Lightweight cryptography: CSRC. National Institute of Standards and Technology, Information Technology Laboratory, Computer Security Resource Center, Jan. 3, 2017, 4 pages. [Retrieved on Aug. 30, 2022, from https://csrc.nist.gov/Projects/lightweight-cryptography].

* cited by examiner

SECURITY AND RELIABILITY DETECTION FOR A SENSOR COMMUNICATION CHANNEL

BACKGROUND

There are many applications in which sensors are used. A sensor typically communicates with an external device that uses sensor information generated by the sensor to perform additional tasks. As a result, communications between the sensor and the external device should be reliable and secure to ensure proper operation of a system. For example, functional safety, reliability, and cybersecurity have all become important aspects of electronic systems in a vehicle.

SUMMARY

In some implementations, a monitoring system includes a sensor configured to generate a sensor signal based on a measured property; a controller configured to communicate with the sensor; and a communication channel electrically coupled to the sensor and the controller for carrying electrical communications therebetween, wherein the sensor includes a transmitter configured to transmit an electrical signal on the communication channel to the controller, and wherein the controller includes a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold.

In some implementations, a method includes measuring an actual signal function response of an electrical signal; correlating the actual signal function response with a reference signal function response to generate a correlation result; comparing the correlation result to a correlation threshold; and detecting a fault on a condition that the correlation result satisfies the correlation threshold.

In some implementations, a monitoring system includes a controller configured to generate an electrical signal; a sensor configured to generate a sensor signal based on a measured property and communicate with the controller; and a communication channel electrically coupled to the sensor and the controller for carrying electrical communications therebetween, wherein the controller includes a transmitter configured to transmit the electrical signal on the communication channel to the sensor, and wherein the sensor includes a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold.

BRIEF DESCRIPTION OF THE DRAWINGS

Implementations are described herein making reference to the appended drawings.

DETAILED DESCRIPTION

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to an orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances (e.g., within 5%) that are deemed acceptable in the industry without departing from the aspects of the implementations described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A sensor may refer to a component which converts a property to be measured to an electric signal, for example, a current signal or a voltage signal. The property may, for example, comprise a magnetic field, an electric field, a photon, an electromagnetic wave, a pressure, a force, a current, or a voltage, but is not limited thereto. The sensor may be incorporated into an electronic system to provide sensor information to one or more components of the electronic system through one or more physical communication channels that carry electrical communication signals.

For example, the electronic system may be part of a vehicle. Cybersecurity is growing in importance in the automotive industry, particularly for the topic of vehicle tuning. During vehicle tuning, a vehicle component may be physically modified to enable additional or extended features in the vehicle (e.g., more or less horsepower). Sensors represent a class of vehicle components that is prone to security attacks. Sensors are attractive to security attacks because cybersecurity protections available within the sensors are typically at a minimum, often motivated by a need for low production costs for the sensors, particularly in vehicle systems in which a number of sensors is high. Sometimes, a security attack may target the one or more physical communication channels that are coupled to a sensor. As a result, the security attack can be used to alter an operation of the sensor or can be used to alter the sensor information provided by the sensor. For example, a security attack directed at the sensor may cause incorrect sensor information to be provided to the electronic system of the vehicle, resulting in a faulty or otherwise incorrect operation of the electronic system.

Reliability of vehicle components is also important. Failing vehicle components can cause unsafe operation of a vehicle. Accordingly, the failing vehicle components cause a need for repair and maintenance. Early detection of a failing vehicle component is important to ensure a reliable and safe operation of the vehicle. A sensor that is used as a vehicle component and that is no longer operating correctly may cause incorrect sensor information to be transmitted to the electronic system of the vehicle, resulting in a faulty or otherwise incorrect operation of the electronic system, vehicle components that depend on operation the electronic system, and the vehicle as a whole.

Some implementations disclosed herein are directed to a detection mechanism which enables detection of a security attack on a sensor system while avoiding a cost of expensive cryptographic measures. For example, the detection mechanism may monitor one or more physical communication channels that are coupled to a sensor for abnormalities indicative of a security attack. The detection mechanism may be configured in a way that expensive cybersecurity protections integrated within the sensor can be avoided to save costs.

Additionally, or alternatively, in some implementations, the detection mechanism may monitor the one or more physical communication channels that are coupled to the sensor for abnormalities indicative of a component failure (e.g., abnormal operation of the sensor). As a result, the detection mechanism may monitor the one or more physical communication channels for both security attacks and for faulty component operation to ensure safe, secure, and reliable operation of the electronic system.

Figure 1A:
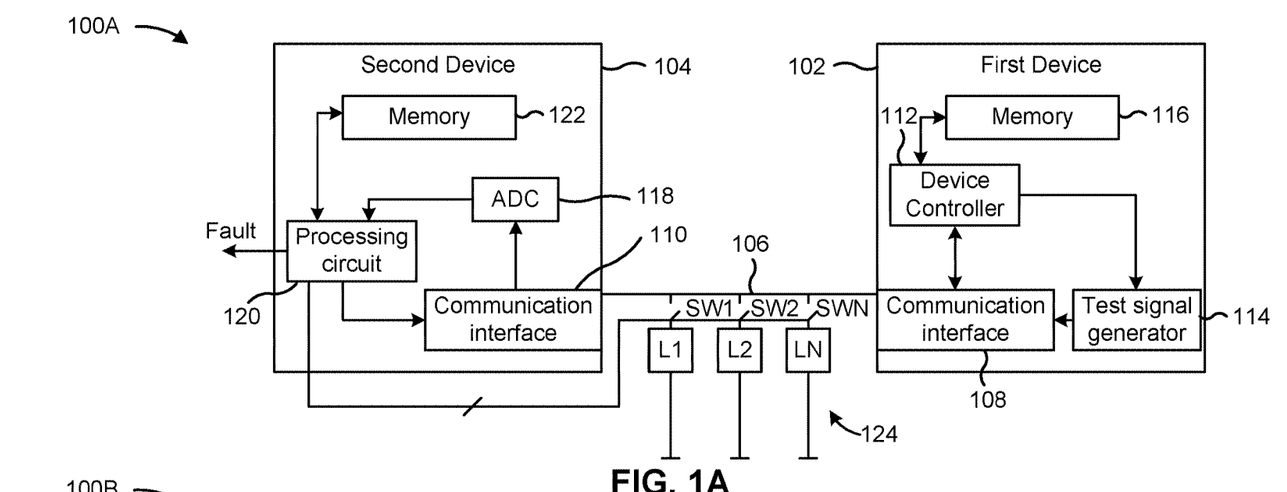
FIG. 1A illustrates a schematic block diagram of an electronic system according to one or more implementations.

FIG. 1A illustrates a schematic block diagram of an electronic system 100A according to one or more implementations. The electronic system 100A includes a first device 102, a second device 104, and a communication channel 106 electrically coupled to the first device 102 and the second device 104 for carrying electrical communications therebetween.

In some implementations, the electronic system 100A may be a sensor communication system in which the first device 102 is a sensor configured to generate a sensor signal based on a measured property and the second device 104 is an external controller, such as a microcontroller or an electronic control unit (ECU) of a vehicle. In some implementations, the electronic system 100A may be a sensor communication system in which the first device 102 is the external controller and the second device 104 is the sensor configured to generate the sensor signal based on the measured property. The sensor signal may include sensor information, including sensor values or other measurement data, that is representative of the measured property. The second device 104 is configured to communicate with the first device 102 via the communication channel 106. The electronic system 100A may include a monitoring system used to detect security attacks and component failures of the electronic system 100A.

At least one of the first device 102 or the second device 104 may be configured to transmit electrical communications on the communication channel 106 in the form of electrical signals. For example, the sensor may be configured to transmit and the external controller may be configured to receive electrical signals that include sensor information generated by the sensor that represents the measured property or status information that indicates a status of the sensor. Additionally, in some implementations, the electrical signals transmitted by the sensor and received by the external controller may include test signals. The external controller may be configured to transmit and the sensor may be configured to receive electrical signals that include at least one of commands, triggers, or configuration information. Additionally, in some implementations, the electrical signals transmitted by the external controller and received by the sensor may include test signals.

The communication channel 106 is a physical communication channel (e.g., a wired communication channel). The communication channel 106 may be a communication channel for Short-PWM-Code (SPC) communications, Peripheral Sensor Interface 5 (PSI5) communications, or another type of communications implemented between two devices.

In the example illustrated in FIG. 1A, the communication channel 106 is an analog communication channel used to carry analog electrical signals. In some implementations, the analog electrical signals include the electrical signals transmitted by the first device 102 to the second device 104 (e.g., for downlink electrical communications). In some implementations, the analog electrical signals include the electrical signals transmitted by the second device 104 to the first device 102 (e.g., for uplink electrical communications). In some implementations, the analog electrical signals include both the electrical signals transmitted by the first device 102 to the second device 104 and the electrical signals transmitted by the second device 104 to the first device 102 (e.g., for bidirectional electrical communications).

The first device 102 includes a communication interface 108. In some implementations, the communication interface 108 is a transmitter configured to transmit the electrical signals on the communication channel 106. In some implementations, the communication interface 108 is a receiver configured to receive the electrical signals from the communication channel 106. In some implementations, the communication interface 108 is a transceiver configured to transmit and/or receive the electrical signals.

The second device 104 includes a communication interface 110. In some implementations, the communication interface 110 is a transmitter configured to transmit the electrical signals on the communication channel 106. In some implementations, the communication interface 110 is a receiver configured to receive the electrical signals from the communication channel 106. In some implementations, the communication interface 110 is a transceiver configured to transmit and/or receive the electrical signals.

By evaluating the electrical signals transmitted on the communication channel 106, a security attack or a component failure can be detected by a receiving device (e.g., the first device 102 or the second device 104). In particular, two electrical signals having a same or substantially similar signal pattern or signal waveform are used to perform an evaluation of whether a security attack or a component failure is present in the electronic system 100A. In some implementations, the two electrical signals are generated by the first device 102 and evaluated by the second device 104. In some implementations, the two electrical signals are generated by the second device 104 and evaluated by the first device 102.

In some implementations, the first electrical signal and the second electrical signal are two distinct signals that are transmitted during two transmission periods separated by either a non-transmission period during which no electrical signals are transmitted on the communication channel 106 and/or separated by another transmission period during which another electrical signal is transmitted on the communication channel 106.

In some implementations, the first electrical signal and the second electrical signal are different portions of a continuous electrical signal that are sampled at different intervals. For example, the continuous electrical signal may be a periodical electrical signal having one or more first signal periods corresponding to the first electrical signal (e.g., a first plurality of samples may be generated from the one or more first signal periods) and one or more second signal periods corresponding to the second electrical signal (e.g., a second plurality of samples may be generated from the one or more second signal periods).

A first electrical signal of the two electrical signals may be measured by generating a signal function response of the first electrical signal, which is stored in memory as a reference signal function response. As a result, the first electrical signal of the two electrical signals may be referred to as a reference signal. According to one or more implementations described herein, a "signal function response" may be a frequency response or a time domain response of the electrical signal. For example, a processing circuit of the receiving device (e.g., the first device 102 or the second device 104) may be configured to apply a discrete Fourier transform to the electrical signal or digital samples of the electrical signal to generate the signal function response, apply a wavelet transform to the received electrical signal or the digital samples of the electrical signal to generate the signal function response, or obtain an envelope of the electrical signal or the digital samples of the electrical signal and use the envelop as the signal function response.

In some implementations, a reference signal can be generated and the reference signal function response measured during commissioning of the electronic system 100A (e.g., during initialization of the electronic system 100A). Additionally, a new reference signal can be generated, and the reference signal function response updated, for example, during recalibration of the electronic system 100A (e.g., after changes of components of the first device 102, the second device 104, or the communication channel 106).

A second electrical signal of the two electrical signals, transmitted subsequent to the first electrical signal, may be measured by generating a signal function response of the second electrical signal. The signal function response of the second electrical signal may be referred to as an "actual" signal function response that is to be correlated with the reference signal function response to generate a correlation value.

The correlation value can then be compared with a correlation threshold to produce a comparison result, and a fault detected based on the comparison result indicating that the correlation value satisfies the correlation threshold. For example, the fault can be detected based on the comparison result indicating that the correlation value is less than the correlation threshold. For example, when the correlation value is less than the correlation threshold, it can be determined that the signal waveform of the second electrical signal differs from the signal waveform of the first electrical signal by an amount that is greater than expected if the electronic system 100A were operating normally and as expected. Accordingly, the fault can be used to indicate that either the security attack or the component failure is present.

For example, the security attack may include a malicious modification of the communication channel 106 (e.g., a man-in-the-middle-attack), a complete replacement of the first device 102 (e.g., an authenticity attack), or a tapping of the communication channel 106 for analyzing or recording of transmitted messages (e.g., a side-channel attack). Each type of security attack results in an electrical signal being received at a receiving end of the communication channel 106 that has a signal waveform that deviates from a signal waveform that is expected, which can be detected by the receiving device (e.g., the first device 102 or the second device 104) when performing a comparison based on the correlation threshold.

A component failure may include a faulty component at the first device 102, the second device 104, or the communication channel 106, including a degradation of reliability characteristics of wires and/or circuit components part of the first device 102, the second device 104, or the communication channel 106. When the first device 102 or the communication channel 106 is operating abnormally (e.g., due to the component failure), the electrical signal transmitted by the first device 102 and received by the second device 104 may have a signal waveform that deviates from the signal waveform that is expected, which can be detected by the second device 104 when performing a comparison based on the correlation threshold. When the second device 104 or the communication channel 106 is operating abnormally (e.g., due to the component failure), the electrical signal transmitted by the second device 104 and received by the first device 102 may have a signal waveform that deviates from the signal waveform that is expected, which can be detected by the first device 102 when performing a comparison based on the correlation threshold.

The first device 102 may include a device controller 112 (e.g., a microcontroller) that is configured to control the electrical communications generated by the first device 102 and/or process the electrical communications received from the communication channel 106. For example, the device controller 112 may provide the sensor signal or a status signal that indicates the status of the first device 102 to the communication interface 108 for transmission on the communication channel 106. In some implementations, the device controller 112 may be configured to provide the first electrical signal and/or the second electrical signal to the communication interface 108 for transmission on the communication channel 106 to be evaluated by the second device 104.

In some implementations, the first device 102 may include a test signal generator 114 that is configured to generate test signals (e.g., as the first electrical signal and the second electrical signal) for transmission on the communication channel 106. The device controller 112 may be configured to trigger the test signal generator 114 to generate a test signal for transmission on the communication channel 106. The test signal generator 114 may be configured to generate a same test signal each time the test signal generator 114 is triggered by the device controller 112.

Additionally, or alternatively, the device controller 112 may be configured to control the test signal generator 114 to generate the test signal with a signal configuration (e.g., a signal pattern or signal waveform) by configuring one or more test signal parameters of the test signal. The test signal parameters may include a number of pulses, a signal frequency, a signal amplitude, a pulse shape, a pulse width, or any other signal parameter that modulates the signal configuration. The test signal generator 114 is configured to generate the test signals and provide the test signals to the communication interface 108 for transmission on the communication channel 106.

In some implementations, the first device 102 includes a memory 116 that is configured to store a plurality of signal configurations, with each signal configuration of the plurality of signal configurations corresponding to a different set of test signal parameters. Accordingly, the device controller 112 may select one or more signal configurations from the plurality of signal configurations stored in memory 116 for configuring the test signal generator 114. The device controller 112 may configure the test signal generator 114 to generate a same test signal (e.g., having a same signal configuration) for two distinct electrical communications in order to enable the second device 104 to perform a test for evaluating whether a security attack or a component failure is present in the electronic system 100A.

Additionally, or alternatively, the device controller 112 may configure the test signal generator 114 to generate different test signals (e.g., having different signal configurations) for two distinct electrical communications. For example, the device controller 112 may randomly select a signal configuration out of the plurality of signal configurations stored in memory 116 for generating a test signal to reduce a likelihood that the test signal can be replicated during a security attack. The signal configuration selected by the device controller 112 may be indicated to the second device 104 to enable the second device 104 to perform the test of the communication channel 106. For example, the second device 104 may store a plurality of reference signal function responses and select a reference signal function response corresponding to the signal configuration selected by the device controller 112 for use in evaluating whether a security attack or a component failure is present in the electronic system 100A.

The communication interface 108 may be configured to transmit and the communication interface 110 may be configured to receive the first electrical signal (e.g., the reference signal). The first electrical signal may be the sensor signal, the status signal, the test signal, or any other electrical signal capable of being retransmitted, repeated, or otherwise duplicated as the second electrical signal by the first device 102.

The second device 104 may include an analog-to-digital converter (ADC) 118, a processing circuit 120, and a memory 122. The ADC 118 may be configured to generate or otherwise acquire a first plurality of digital samples of the first electrical signal at a first plurality of sampling times. The processing circuit 120 may include at least one processor and may use the first plurality of digital samples to generate a reference signal function response of the first electrical signal and store the reference signal function response in the memory 122. The processing circuit 120 may be configured to apply a discrete Fourier transform to the first electrical signal or digital samples of the first electrical signal to generate the reference signal function response, apply a wavelet transform to the first electrical signal or the digital samples of the first electrical signal to generate the reference signal function response, or obtain an envelope of the first electrical signal or the digital samples of the first electrical signal and use the envelop as the reference signal function response.

In addition, the communication interface 108 may be configured to transmit and the communication interface 110 may be configured to receive the second electrical signal that has the same or substantially similar signal waveform as the first electrical signal. The ADC 118 may be configured to generate or otherwise acquire a second plurality of digital samples of the second electrical signal at a second plurality of sampling times. The processing circuit 120 may use the second plurality of digital samples to generate an actual signal function response of the second electrical signal, which may also be stored in the memory 122. The processing circuit 120 may be configured to apply a discrete Fourier transform to the second electrical signal or digital samples of the second electrical signal to generate the actual signal function response, apply a wavelet transform to the second electrical signal or the digital samples of the second electrical signal to generate the actual signal function response, or obtain an envelope of the second electrical signal or the digital samples of the second electrical signal and use the envelop as the actual signal function response.

The processing circuit 120 is further configured to correlate the actual signal function response with the reference signal function response stored in the memory 122 to generate the correlation value, compare the correlation value and the correlation threshold to produce a comparison result, and detect the fault based on the comparison result indicating that the correlation value satisfies the correlation threshold. If the processing circuit 120 detects the fault, the processing circuit 120 may generate an error signal signaling the fault. The fault may indicate that a security attack or a component failure has occurred.

Accordingly, the electronic system 100A provides a detection mechanism configured to monitor the communication channel 106 for both security attacks and for faulty component operation to ensure safe, secure, and reliable operation of the electronic system 100A. The detection mechanism, including components used for transmitting the second electrical signal on the communication channel 106 and components used for evaluating the actual signal function response with the correlation threshold, may be configured to perform a test during normal operation at edges of a communication protocol, in an interval between two communications of the communication protocol. Additionally, or alternatively, the detection mechanism may be configured to perform the test using known (e.g., predetermined) parts of the communication protocol, such as a start sequence or a sensor address. The detection mechanism is capable of using known parts of the communication protocol because the signal waveforms of the electrical signals transmitted during these known parts of the communication protocol are known by the electronic system 100A. For example, the start sequence of the electronic system 100A may include transmitting the same one or more electrical signals. Similarly, the sensor address is fixed and, therefore, the electrical signal used for transmitting the sensor address is known. Thus, the signal function response of an electrical signal transmitted during a known part of the communication protocol may be used as the reference signal function response and then used as the actual signal function response for a subsequent measurement. In addition, the detection mechanism can be implemented without cryptographic protocols, thereby providing a lower cost solution relative to systems that implement cryptographic protocols. In addition, the detection mechanism can be implemented on one side of the communication channel 106. Therefore, the detection mechanism can be used for unidirectional communication channels as well as bidirectional communication channels.

In some implementations, the test signal generator 114 may be configured to generate a plurality of electrical signals, wherein each of the plurality of electrical signals has a different signal waveform of a plurality of different signal waveforms. The memory 122 may be configured to store a plurality of reference signal function responses, with each reference signal function response of the plurality of reference signal function responses being a respective reference signal function that corresponds to a different one of the plurality of different signal waveforms.

The communication interface 108 may be configured to transmit and the communication interface 110 may be configured to receive the plurality of electrical signals and the processing circuit 120 may be configured to receive each of the plurality of electrical signals, measure a respective actual signal function response of each of the plurality of electrical signals, correlate each respective actual signal function response with the respective reference signal function response to generate a plurality of respective correlation values, compare each of the plurality of respective correlation values and the correlation threshold to produce comparison results, and detect the fault based on the comparison results indicating that any of the plurality of respective correlation values satisfies the correlation threshold. The plurality of electrical signals provide signal diversity that would be difficult for an attacker to copy or replicate. For example, signal diversity may impede the attacker from predicting a manner in which the sequence of electrical signals is transmitted to avoid detection. As a result, the plurality of electrical signals may provide a more robust detection scheme for detecting a security attack and may increase a likelihood of detecting the security attack.

In some implementations, the ADC 118 may be configured to generate a third plurality of digital samples of the second electrical signal at a third plurality of sampling times. In some implementations, the second plurality of sampling times of the second electrical signal may correspond to a first signal period or a first interval of the second electrical signal and the third plurality of sampling times of the second electrical signal may correspond to a second signal period or a second interval of the second electrical signal. The ADC 118 may be configured such that the third plurality of sampling times are subsequent to the second plurality of sampling times.

The second plurality of sampling times and the third plurality of sampling times can be used to vary a sampling point of the second electrical signal to obtain a higher measurement resolution of the second electrical signal. A sampling rate of the ADC 118 may be limited, for example, due to cost or design constraints. However, a higher measurement resolution provides more accurate results and may be less susceptible to measurement noise or channel noise. A measurement resolution of the second electrical signal is directly proportional to the sampling rate. A sampling offset can be used to increase the measurement resolution of the ADC 118. An acquisition scheme implemented by the ADC 118 for increasing the measurement resolution of the ADC 118 is described in greater detail in conjunction with FIG. 2.

The processing circuit 120 may use the third plurality of digital samples to generate the actual signal function response of the second electrical signal, which may also be stored in the memory 122. In some implementations, the processing circuit 120 may generate the actual signal function response of the second electrical signal as a function of the second plurality of digital samples and the third plurality of digital samples. For example, the processing circuit 120 may calculate an average of the second plurality of digital samples and the third plurality of digital samples and generate the actual signal function response of the second electrical signal based on the average. Alternatively, the processing circuit 120 may generate a first signal function response based on the second plurality of digital samples, generate a second signal function response based on the third plurality of digital samples, and calculate an average of the first signal function response and the second signal function response as the actual signal function response of the second electrical signal. Repeated measurements and averaging operations can help to reduce an impact of measurement noise and channel noise, which can help to ensure that the correlation value is accurate and that any measurement noise or channel noise that may be present is mitigated. Accordingly, the repeated measurements and the averaging operations can help to avoid a false detection of the fault that may otherwise result from the measurement noise or the channel noise.

In some implementations, the electronic system 100A may include a configurable load circuit 124 coupled to the communication channel 106. The configurable load circuit 124 includes N loads (e.g., a plurality of loads, including load L1, load L2, . . . , load LN) that change an electrical characteristic of the communication channel 106, where N is an integer greater than zero. One or more of the N loads may be the same or all of the N loads may be different. A change in the electrical characteristic of the communication channel 106 results in a different signal function response being measured. In other words, electrical signals with a same signal waveform that are transmitted under different load conditions applied to the communication channel 106 may result in two different signal function responses being intended.

As a result, a same electrical signal may be periodically or continuously transmitted on the communication channel 106 under different load conditions. This may simplify transmitter circuitry at the first device 102 which, for example, may result in lower manufacturing costs. For example, an ability to periodically transmit the same electrical signal may simplify a configuration of the test signal generator 114 and/or the device controller 112. Additionally, or alternatively, the ability to periodically transmit the same electrical signal may reduce or eliminate a storage of different signal configurations in the memory 116, thereby reducing a size of the memory 116 or freeing up memory resources for other functions of the first device 102. On the other hand, signal diversity may still be achieved by changing the electrical characteristic of the communication channel 106. As noted above, signal diversity may increase the difficulty for an attacker to copy or replicate a sequence of electrical signals. For example, signal diversity may impede the attacker from predicting a manner in which the sequence of electrical signals is transmitted to avoid detection. As a result, the plurality of electrical signals may provide a more robust detection scheme for detecting a security attack and may increase a likelihood of detecting the security attack.

Each of the N loads may include one or more load components, such as one or more resistors, one or more capacitors, or a combination of one or more resistors and one or more capacitors. Each of the N loads may be switchably connected to the communication channel 106 by a respective switch that is controlled by the second device 104. For example, a switching state of a first switch SW1 may be configured to connect a first load L1 to or disconnect the first load L1 from the communication channel 106, a switching state of a second switch SW2 may be configured to connect a second load L2 to or disconnect the second load L2 from the communication channel 106, and a switching state of an Nth switch SWN may be configured to connect an Nth load LN to or disconnect the Nth load LN from the communication channel 106.

Two loads may be simultaneously connected to the communication channel 106 to provide a combined load to the communication channel 106. Accordingly, the N loads may be connected to the communication channel 106 in any combination based on a configuration of the switching states of the first switch SW1, the second switch SW2, and the Nth switch SWN. Additionally, it is conceivable that all of the N loads may be simultaneously disconnected from the communication channel 106 such that the configurable load circuit 124 does not apply a load to the communication channel 106 (e.g., a zero load is applied by the configurable load circuit 124). In other words, the N loads may include a zero load condition. Accordingly, a plurality of different loads may be realized by controlling the switching states of the first switch SW1, the second switch SW2, and the Nth switch SWN.

The processing circuit 120 may be configured to generate control signals for controlling the switching states of the first switch SW1, the second switch SW2, and the Nth switch SWN. In addition, the memory 122 may be configured to store a plurality of reference signal function responses, where each of the plurality of reference signal function responses is correlated with an electrical signal and a respective load corresponding to a configuration of the switching states of first switch SW1, the second switch SW2, and the Nth switch SWN. The processing circuit 120 may be configured to select the reference signal function response from the plurality of reference signal function responses that corresponds to the electrical signal transmitted by the first device 102 and that corresponds to the configuration of the switching states of first switch SW1, the second switch SW2, and the Nth switch SWN, and use the reference signal function response for generating the correlation value.

In some implementations, the processing circuit 120 may be configured to iteratively perform a plurality of measurements of the electrical signal under different load conditions applied by the configurable load circuit 124 to achieve signal diversity.

For example, during a first measurement of the electrical signal, the processing circuit 120 may be configured to select the first load L1, connect the first load L1 to the communication channel 106 during the first measurement of the electrical signal, and measure a first actual signal function response of the electrical signal while the first load L1 is connected to the communication channel 106. In addition, during a second measurement of the electrical signal the processing circuit 120 may be configured to select the second load L2, or another load different from the first load L1, connect the second load L2 to the communication channel 106 during the second measurement of the electrical signal, and measure a second actual signal function response of the electrical signal while the second load L2 is connected to the communication channel 106. Additional measurements of the electrical signal may be performed by the processing circuit 120, with each measurement being obtained under a different load condition. For example, the additional measurements of the electrical signal may be iteratively performed by the processing circuit 120 until all possible load conditions or a subset of all possible load conditions have been applied to the communication channel 106.

The processing circuit 120 may be configured to correlate the first actual signal function response with a first reference signal function response correlated with the first load L1 to generate a first correlation value, correlate the second actual signal function response with a second reference signal function response correlated with the second load L2 to generate a second correlation value, and detect the fault based on at least one of the first correlation value or the second correlation value satisfying the correlation threshold. The processing circuit 120 may generate a correlation value for each measurement of the electrical signal. Therefore, the processing circuit 120 may generate a correlation value that is to be compared with the correlation threshold for each load condition under test. In some implementations, correlation values derived from multiple measurements can be combined (e.g., averaged, summed, etc.) to generate a combined value for comparison with the correlation threshold.

As indicated above, FIG. 1A is provided merely as an example. Other examples are possible and may differ from what was described with regard to FIG. 1A. In practice, the first device 102 or the second device 104 may include additional components, fewer components, different components, or differently arranged components than those shown in FIG. 1A without deviating from the disclosure provided above. Two or more components shown in FIG. 1A may be implemented within a single component, or a single component shown in FIG. 1A may be implemented as multiple, distributed components. Additionally, or alternatively, a set of components (e.g., one or more components) of the first device 102 or the second device 104 may perform one or more functions described as being performed by another set of components of the first device 102 or the second device 104.

Figure 1B:
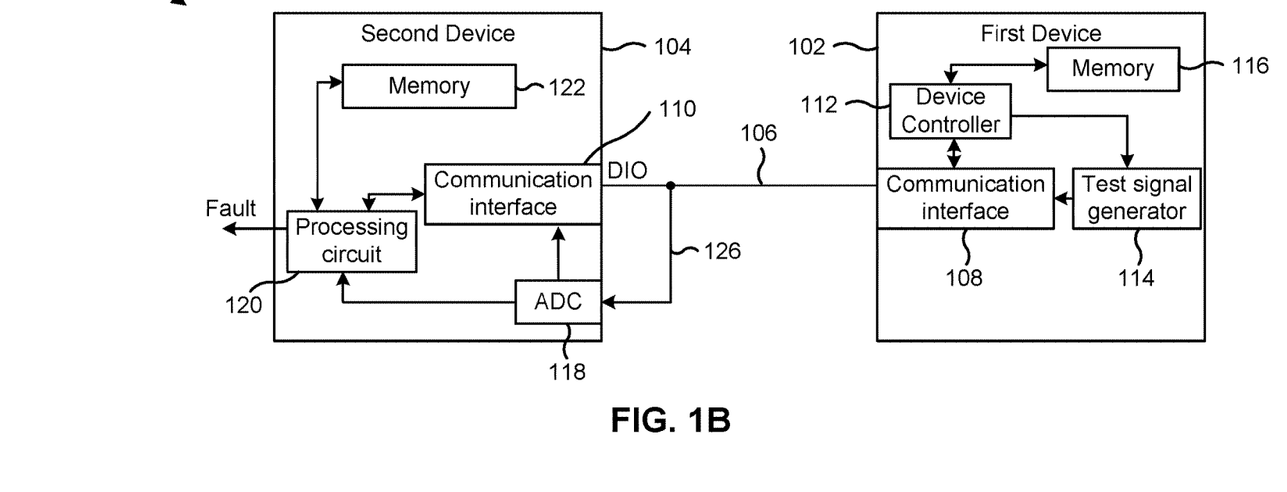
FIG. 1B illustrates a schematic block diagram of an electronic system according to one or more implementations.

FIG. 1B illustrates a schematic block diagram of an electronic system 100B according to one or more implementations. The electronic system 100B is similar to the electronic system 100A described in conjunction with FIG. 1A, with an exception that the communication channel 106 is a digital communication channel for digital electrical signals. The communication interface 110 includes a digital input/output (DIO) terminal for transmitting and receiving the digital electrical signals. The processing circuit 120, connected to the communication interface 110, may be configured to generate digital electrical signals for transmission by the communication interface 110 or may be configured to process digital electrical signals received by the communication interface 110.

In addition, the ADC 118 is connected to the communication channel 106 by signal path 126 for receiving digital signals transmitted on the communication channel 106. While the ADC 118 does not perform an analog-to-digital conversion, as the electrical signals are already digital, the ADC 118 is used to generate or otherwise acquire digital samples of the electrical signals using any of the methods described above in conjunction with FIG. 1A.

The processing circuit 120 is configured to evaluate the digital samples using any of the methods described above in conjunction with FIG. 1A. If a fault is detected, the processing circuit 120 may be configured to generate the error signal that indicated the fault. The fault may indicate that a security attack or a component failure has occurred. Accordingly, the electronic system 100B provides a detection mechanism configured to monitor the communication channel 106 for both security attacks and for faulty component operation to ensure safe, secure, and reliable operation of the electronic system 100B.

As indicated above, FIG. 1B is provided merely as an example. Other examples are possible and may differ from what was described with regard to FIG. 1B. In practice, the first device 102 or the second device 104 may include additional components, fewer components, different components, or differently arranged components than those shown in FIG. 1B without deviating from the disclosure provided above. Two or more components shown in FIG. 1B may be implemented within a single component, or a single component shown in FIG. 1B may be implemented as multiple, distributed components. Additionally, or alternatively, a set of components (e.g., one or more components) of the first device 102 or the second device 104 may perform one or more functions described as being performed by another set of components of the first device 102 or the second device 104.

Figure 2:
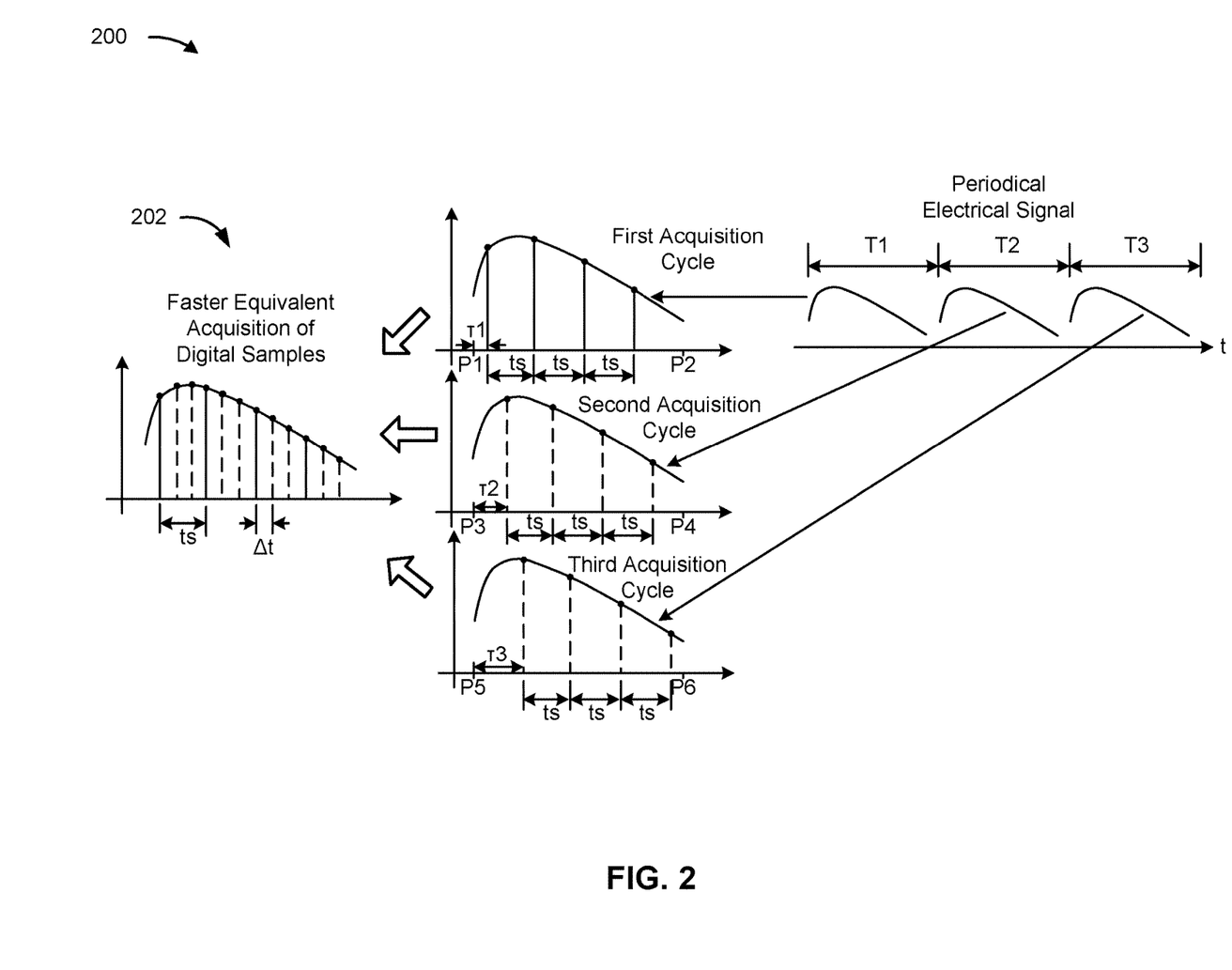
FIG. 2 illustrates an acquisition scheme implemented by an analog-to-digital converter (ADC) for generating different pluralities of digital samples of a continuous electrical signal according one or more implementations.

FIG. 2 illustrates an acquisition scheme 200 implemented by the ADC 118 for generating three different pluralities of digital samples of a continuous electrical signal according one or more implementations. FIG. 2 shows the continuous electrical signal having three signal periods, including a first signal period T1, a second signal period T2, and a third signal period T3 of equal interval lengths (e.g., length of T1=length of T2=length of T3). Accordingly, the continuous electrical signal is a periodical electrical signal. The continuous electrical signal may be any electrical signal described herein, including the reference electrical signal or the electrical signal to be measured for performing an evaluation.

The first signal period T1 has a first interval length defined by a first starting point P1 and a first ending point P2. The first interval length corresponds to a first acquisition cycle of the ADC 118 during which a first of the three different pluralities of digital samples are generated. The ADC 118 is configured to start generating the first of the three different pluralities of digital samples at a first initial sampling time that is offset from the first starting point P1 by a first offset $\tau 1$, which may be zero or greater. The ADC 118 generates the first of the three different pluralities of digital samples at regular sampling intervals ts within the first acquisition cycle. In some implementations, the ADC 118 may be configured to generate the first of the three different pluralities of digital samples at first irregular sampling intervals within the first acquisition cycle to provide additional measurement diversity that may be more robust against measurement noise and channel noise.

The second signal period T2 has a second interval length defined by a second starting point P3 and a second ending point P4. The second interval length corresponds to a second acquisition cycle of the ADC 118 during which a second of the three different pluralities of digital samples are generated. The ADC 118 is configured to start generating the second of the three different pluralities of digital samples at a second initial sampling time that is offset from the second starting point P3 by a second offset $\tau 2$, which is greater than zero and different from the first offset $\tau 1$. The ADC 118 generates the second of the three different pluralities of digital samples at the regular sampling intervals ts within the second acquisition cycle. In some implementations, the ADC 118 may be configured to generate the second of the three different pluralities of digital samples at second irregular sampling intervals within the second acquisition cycle to provide additional measurement diversity that may be more robust against measurement noise and channel noise.

The third signal period T3 has a third interval length defined by a third starting point P5 and a third ending point P6. The third interval length corresponds to a third acquisition cycle of the ADC 118 during which a third of the three different pluralities of digital samples are generated. The ADC 118 is configured to start generating the third of the three different pluralities of digital samples at a third initial sampling time that is offset from the third starting point 135 by a third offset $\tau 3$, which is greater than zero and different from the first offset T1 and the second offset $\tau 2$. The ADC 118 generates the third of the three different pluralities of digital samples at the regular sampling intervals ts within the third acquisition cycle. In some implementations, the ADC 118 may be configured to generate the third of the three different pluralities of digital samples at third irregular sampling intervals within the third acquisition cycle to provide additional measurement diversity that may be more robust against measurement noise and channel noise.

The ADC 118 may combine the three different pluralities of digital samples to obtain a faster equivalent acquisition of digital samples 202 with a sampling interval $\Delta t$ between digital samples that is shorter than the regular sampling interval ts. The processing circuit 120 may generate a signal function response using the three different pluralities of digital samples. The acquisition scheme 200 may be used to generate the reference signal function response or the actual signal function response described above in conjunction with FIGS. 1A and 1B.

Although FIG. 2 illustrates an example of acquisition scheme 200, in some implementations, digital samples may be generated or otherwise acquired in a different manner from a manner depicted in FIG. 2. In some implementations, the digital samples may be generated or otherwise acquired using more or less acquisition cycles.

Figure 3:
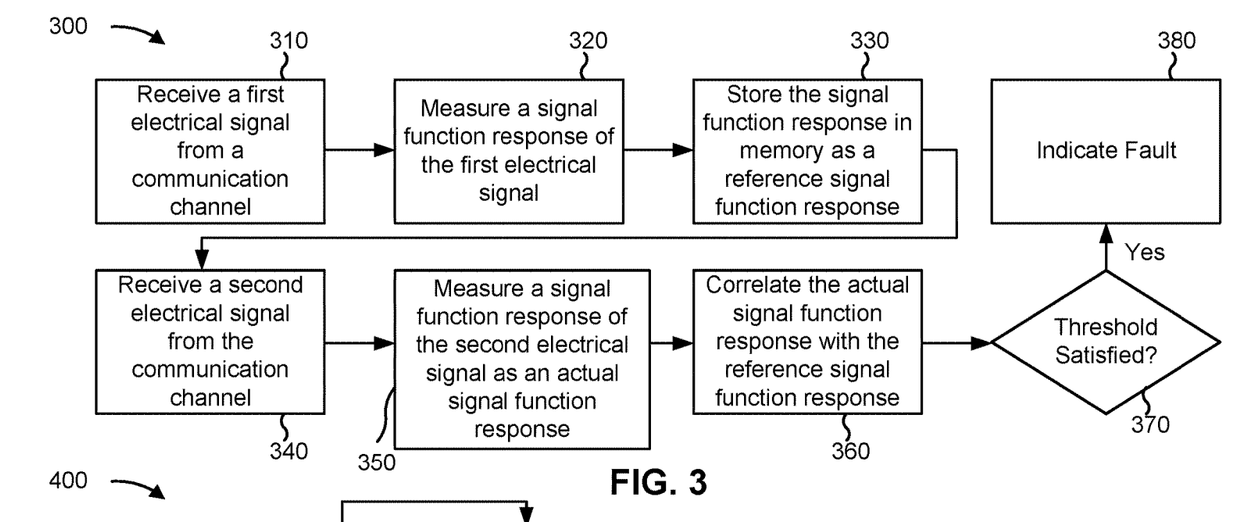
FIG. 3 illustrates a flowchart of an example process associated with a monitoring system.

FIG. 3 illustrates a flowchart of an example process 300 associated with a monitoring system. In some implementations, one or more process blocks of FIG. 3 may be performed by a first device (e.g., first device 102) or a second device (e.g., second device 104). Additionally, or alternatively, one or more process blocks of FIG. 3 may be performed by one or more components of the first device or the second device, such as a communication interface (e.g., communication interface 108 or communication interface 110), a device controller (e.g., device controller 112), a test signal generator (e.g., test signal generator 114), an ADC (e.g., ADC 118), a processing circuit (e.g., processing circuit 120), a memory (e.g., memory 116 or memory 122), a configurable load circuit (e.g., configurable load circuit 124), and/or the like.

As shown in FIG. 3, process 300 may include receiving a first electrical signal from a communication channel (block 310). For example, the communication interface 110 may receive the first electrical signal from the communication channel 106, as described above.

As further shown in FIG. 3, process 300 may include measuring a signal function response of the first electrical signal (block 320). For example, the processing circuit 120 may generate the signal function response of the first electrical signal, as described above.

As further shown in FIG. 3, process 300 may include storing the signal function response of the first electrical signal as a reference signal function response in memory (block 330). For example, the processing circuit 120 may store the signal function response of the first electrical signal as the reference signal function response in the memory 122, as described above.

As further shown in FIG. 3, process 300 may include receiving a second electrical signal from the communication channel (block 340). For example, the communication interface 110 may generate the second electrical signal from the communication channel 106, as described above.

As further shown in FIG. 3, process 300 may include measuring a signal function response of the second electrical signal as an actual signal function response (block 350). For example, the processing circuit 120 may generate the signal function response of the second electrical signal, as described above.

As further shown in FIG. 3, process 300 may include correlating the actual signal function response with the reference signal function response to generate a correlation value (block 360). For example, the processing circuit 120 may correlate the actual signal function response with the reference signal function response to generate the correlation value, as described above.

As further shown in FIG. 3, process 300 may include comparing the correlation value to a correlation threshold (block 370). For example, the processing circuit 120 may compare the correlation value to the correlation threshold, as described above.

As further shown in FIG. 3, process 300 may include indicating a fault if the correlation value satisfies the correlation threshold (block 380). For example, the processing circuit 120 may indicate the fault, as described above.

Process 300 may include additional implementations, such as any single implementation or any combination of implementations described in connection with one or more other processes described elsewhere herein.

Although FIG. 3 shows example blocks of process 300, in some implementations, process 300 includes additional blocks, fewer blocks, different blocks, or differently arranged blocks than those depicted in FIG. 3. Additionally, or alternatively, two or more of the blocks of process 300 may be performed in parallel.

Figure 4:
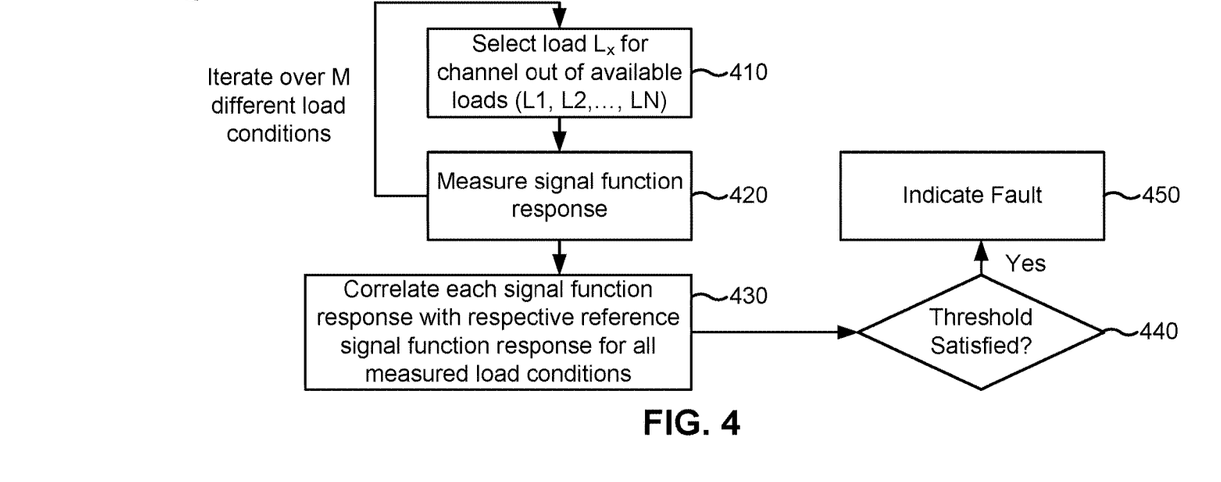
FIG. 4 illustrates a flowchart of an example process associated with a monitoring system.

FIG. 4 illustrates a flowchart of an example process 400 associated with a monitoring system. In some implementations, one or more process blocks of FIG. 4 may be performed by a first device (e.g., first device 102) or a second device (e.g., second device 104). Additionally, or alternatively, one or more process blocks of FIG. 4 may be performed by one or more components of the first device or the second device, such as a communication interface (e.g., communication interface 108 or communication interface 110), a device controller (e.g., device controller 112), a test signal generator (e.g., test signal generator 114), an ADC (e.g., ADC 118), a processing circuit (e.g., processing circuit 120), a memory (e.g., memory 116 or memory 122), a configurable load circuit (e.g., configurable load circuit 124), and/or the like.

As shown in FIG. 4, process 400 may include selecting load Lx out of N available loads (e.g., L1, L2, . . . , LN) to be applied to a communication channel (block 410). For example, the processing circuit 120 may select load Lx out of N available loads (e.g., L1, L2, . . . , LN) of the configurable load circuit 124 to be applied to a communication channel 106, as described above.

As further shown in FIG. 4, process 400 may include measuring an actual signal function response of an electrical signal while load Lx is applied to the communication channel by the configurable load circuit 124 (block 420). For example, the processing circuit 120 may measure the actual signal function response of the electrical signal while load Lx is applied to the communication channel, as described above.

As further shown in FIG. 4, process 400 may include iteratively performing a plurality of M measurements of the electrical signal under M different load conditions, where M is an integer greater than one (blocks 410 and 420). For example, the processing circuit 120 may iteratively perform the plurality of M measurements of the electrical signal under M different load conditions, as described above. M may be an integer that represents all possible load conditions or a subset of all possible load conditions.

As further shown in FIG. 4, process 400 may include correlating actual signal function responses with respective reference signal function responses to generate a plurality of correlation values (block 430). For example, the processing circuit 120 may correlate the actual signal function responses with the respective reference signal function responses to generate the plurality of correlation values, as described above.

As further shown in FIG. 4, process 400 may include comparing the plurality of correlation values to a correlation threshold (block 440). For example, the processing circuit 120 may compare the plurality of correlation values to the correlation threshold, as described above.

As further shown in FIG. 4, process 400 may include indicating a fault if any of the plurality of correlation values satisfy the correlation threshold (block 450). For example, the processing circuit 120 may indicate the fault if any of the plurality of correlation values satisfy the correlation threshold, as described above.

Process 400 may include additional implementations, such as any single implementation or any combination of implementations described in connection with one or more other processes described elsewhere herein.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

Further disclosure is included in the appendix. The appendix is provided as an example only and is to be considered part of the specification. A definition, illustration, or other description in the appendix does not supersede or override similar information included in the detailed description or figures. Furthermore, a definition, illustration, or other description in the detailed description or figures does not supersede or override similar information included in the appendix. Furthermore, the appendix is not intended to limit the disclosure of possible implementations.

What is claimed is:

1. A monitoring system, comprising:
    a sensor configured to generate a sensor signal based on a measured property and generate an electrical signal for transmission;
    an electronic control unit (ECU) configured to communicate with the sensor; and
    a communication channel electrically coupled to the sensor and the ECU for carrying electrical communications therebetween,
        wherein the sensor includes a transmitter configured to transmit the electrical signal on the communication channel to the ECU, and wherein the communication channel directly couples the sensor and the ECU such that the ECU receives the electrical signal directly from the sensor,
        wherein the ECU comprises a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold, wherein the electrical signal is the sensor signal generated by the sensor indicating a value of the measured property, a status signal generated by the sensor indicating a status of the sensor, or a test signal generated by the sensor, wherein the processing circuit comprises:
an analog-to-digital converter (ADC) configured to generate a plurality of samples of the electrical signal at a plurality of sampling times; and
at least one processor configured to measure the actual signal function response based on the plurality of samples,
wherein the plurality of samples is a first plurality of samples and the plurality of sampling times is a first plurality of sampling times,
wherein the ADC is configured to generate a second plurality of samples of the electrical signal at a second plurality of sampling times,
wherein the at least one processor is configured to measure the actual signal function response based on the first plurality of samples and the second plurality of samples, and
wherein the at least one processor is configured to measure a first signal function response of the first plurality of samples, measure a second signal function response of the second plurality of samples, and generate the actual signal function response by averaging the first signal function response and the second signal function response.

2. The monitoring system of claim 1, wherein the actual signal function response is a frequency response or a time domain response of the electrical signal.

3. The monitoring system of claim 1, wherein:
the transmitter is configured to transmit a reference signal on the communication channel to the ECU, the ECU further comprises a memory, and
the processing circuit is configured to receive the reference signal, generate the reference signal function response based on the reference signal, and store the reference signal function response in the memory for correlation with the actual signal function response.

4. The monitoring system of claim 3, wherein the reference signal and the electrical signal have a same signal waveform.

5. The monitoring system of claim 4, wherein the sensor comprises a signal generator configured to generate the reference signal and the electrical signal with the same signal waveform.

6. The monitoring system of claim 1, wherein:
the sensor comprises a signal generator configured to generate a plurality of electrical signals, wherein each of the plurality of electrical signals has a different signal waveform, the transmitter is configured to transmit each of the plurality of electrical signals on the communication channel to the ECU, and
the processing circuit is configured to receive each of the plurality of electrical signals, measure a respective actual signal function response of each of the plurality of electrical signals, correlate each respective actual signal function response with a respective reference signal function response to generate a plurality of respective correlation values, compare each of the plurality of respective correlation values and the correlation threshold to produce comparison results, and detect the fault based on the comparison results indicating that any of the plurality of respective correlation values satisfies the correlation threshold.

7. The monitoring system of claim 1, wherein:
the communication channel is an analog communication channel configured to transmit the electrical signal as an analog electrical signal, and the ADC is configured to generate the plurality of samples from the analog electrical signal, or
the communication channel is a digital communication channel configured to transmit the electrical signal as a digital electrical signal, and the ADC is configured to generate the plurality of samples from the digital electrical signal.

8. The monitoring system of claim 1, wherein the at least one processor is configured to apply a discrete Fourier transform to the plurality of samples to generate the actual signal function response, apply a wavelet transform to the plurality of samples to generate the actual signal function response, or obtain an envelope of the plurality of samples and use the envelop as the actual signal function response.

9. The monitoring system of claim 1, wherein the second plurality of sampling times are subsequent to the first plurality of sampling times.

10. The monitoring system of claim 1, wherein:
the electrical signal is a periodical signal having a first signal period and a second signal period, and
the ADC is configured to generate the first plurality of samples from the first signal period of the electrical signal and generate the second plurality of samples from the second signal period of the electrical signal.

11. The monitoring system of claim 10, wherein:
the first signal period has a first interval length defined by a first starting point and a first ending point, the second signal period has a second interval length defined by a second starting point and a second ending point, the first interval length and the second interval length are equal, the ADC is configured to start generating the first plurality of samples at a first initial sampling time that is offset from the first starting point by a first offset, the ADC is configured to start generating the second plurality of samples at a second initial sampling time that is offset from the second starting point by a second offset, and
the first offset and the second offset are different.

12. The monitoring system of claim 1, wherein the first plurality of sampling times are configured to occur at first regular intervals and the second plurality of sampling times are configured to occur at second regular intervals.

13. The monitoring system of claim 1, wherein the first plurality of sampling times are configured to occur at first irregular intervals and the second plurality of sampling times are configured to occur at second irregular intervals.

14. A monitoring system, comprising:
a sensor configured to generate a sensor signal based on a measured property;
a controller configured to communicate with the sensor;
a communication channel electrically coupled to the sensor and the controller for carrying electrical communications therebetween, wherein the sensor includes a transmitter configured to transmit an electrical signal on the communication channel to the controller, and wherein the controller comprises a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold; and a configurable load circuit coupled to the communication channel, wherein the configurable load circuit is configured to switchably apply a plurality of different loads to the communication channel, wherein the controller comprises a memory configured to store a plurality of reference signal function responses, wherein each of the plurality of reference signal function responses is correlated with a respective load of the plurality of different loads, wherein the controller is configured to iteratively perform a plurality of measurements of the electrical signal, wherein, during a first measurement of the electrical signal:
the controller is configured to select a first load of the plurality of different loads, apply the first load to the communication channel during the first measurement of the electrical signal, and measure a first actual signal function response of the electrical signal, wherein, during a second measurement of the electrical signal:
the controller is configured to select a second load of the plurality of different loads, the second load being different from the first load, apply the second load to the communication channel during the second measurement of the electrical signal, and measure a second actual signal function response of the electrical signal, and wherein the controller is configured to correlate the first actual signal function response with a first reference signal function response correlated with the first load to generate a first correlation value, correlate the second actual signal function response with a second reference signal function response correlated with the second load to generate a second correlation value, and detect the fault based on at least one of the first correlation value or the second correlation value satisfying the correlation threshold.

15. The monitoring system of claim 14, wherein:
the configurable load circuit includes a plurality of switches that are switchably connected to the communication channel, wherein each of the plurality of switches is connected to a respective load, and
the controller is configured to control the plurality of switches for switchably connecting the plurality of different loads to the communication channel.

16. A method, comprising:
receiving an electrical signal from a communication channel that is electrically coupled to a sensor and a controller for carrying electrical communications between the sensor and the controller, wherein the electrical signal is transmitted by the sensor and received by the controller, or the electrical signal is transmitted by the controller and received by the sensor;

adjusting a load applied to the communication channel;
measuring a first actual signal function response of the electrical signal while a first load is being applied to the communication channel;
correlating the first actual signal function response with a first reference signal function response correlated with the first load to generate a first correlation result;
comparing the first correlation result and a correlation threshold to produce a first comparison result; and
detecting a fault based on the first comparison result indicating that the first correlation result satisfies the correlation threshold.

17. A monitoring system, comprising:
a controller configured to generate an electrical signal;
a sensor configured to generate a sensor signal based on a measured property and communicate with the controller;
a communication channel electrically coupled to the sensor and the controller for carrying electrical communications therebetween, wherein the controller includes a transmitter configured to transmit the electrical signal on the communication channel to the sensor; and
a configurable load circuit coupled to the communication channel, wherein the configurable load circuit is configured to switchably apply a plurality of different loads to the communication channel during measurements of the electrical signal to produce a plurality of actual signal function responses of the electrical signal,
wherein the sensor comprises a processing circuit configured to receive the electrical signal, measure an actual signal function response of the electrical signal, correlate the actual signal function response with a reference signal function response to generate a correlation value, compare the correlation value and a correlation threshold to produce a comparison result, and detect a fault based on the comparison result indicating that the correlation value satisfies the correlation threshold, and
wherein the processing circuit is configured to correlate a first actual signal function response of the plurality of actual signal function responses with a first reference signal function response correlated with a first load to generate a first correlation value, correlate a second actual signal function response of the plurality of actual signal function responses with a second reference signal function response correlated with a second load to generate a second correlation value, and detect the fault based on at least one of the first correlation value or the second correlation value satisfying the correlation threshold.

18. The monitoring system of claim 17, wherein the controller is an electronic control unit (ECU), and
wherein the communication channel directly couples the sensor and the controller such that the sensor receives the electrical signal directly from the controller.

19. The monitoring system of claim 1, further comprising:
a configurable load circuit coupled to the communication channel, wherein the configurable load circuit is configured to switchably apply a plurality of different loads to the communication channel during measurements of the electrical signal to produce a plurality of actual signal function responses of the electrical signal,
wherein the processing circuit is configured to correlate a first actual signal function response of the plurality of actual signal function responses with a first reference signal function response correlated with a first load to generate a first correlation value, correlate a second actual signal function response of the plurality of actual signal function responses with a second reference signal function response correlated with a second load to generate a second correlation value, and detect the fault based on at least one of the first correlation value or the second correlation value satisfying the correlation threshold.

20. The monitoring system of claim 1, further comprising:
a configurable load circuit coupled to the communication channel, wherein the configurable load circuit is configured to switchably apply a plurality of different loads to the communication channel,
wherein the ECU comprises a memory configured to store a plurality of reference signal function responses, wherein each of the plurality of reference signal function responses is correlated with a respective load of the plurality of different loads,
wherein the ECU is configured to iteratively perform a plurality of measurements of the electrical signal,
wherein, during a first measurement of the electrical signal:
the ECU is configured to select a first load of the plurality of different loads, apply the first load to the communication channel during the first measurement of the electrical signal, and measure a first actual signal function response of the electrical signal,
wherein, during a second measurement of the electrical signal:
the ECU is configured to select a second load of the plurality of different loads, the second load being different from the first load, apply the second load to the communication channel during the second measurement of the electrical signal, and measure a second actual signal function response of the electrical signal, and
wherein the ECU is configured to correlate the first actual signal function response with a first reference signal function response correlated with the first load to generate a first correlation value, correlate the second actual signal function response with a second reference signal function response correlated with the second load to generate a second correlation value, and detect the fault based on at least one of the first correlation value or the second correlation value satisfying the correlation threshold.

21. The method of claim 16, further comprising:
measuring a second actual signal function response of the electrical signal while a second load is being applied to the communication channel;
correlating the second actual signal function response with a second reference signal function response correlated with the second load to generate a second correlation result;
comparing the second correlation result and a correlation threshold to produce a second comparison result; and
detecting a fault based on the second comparison result indicating that the second correlation result satisfies the correlation threshold.

22. A monitoring system, comprising:
a sensor configured to generate a sensor signal based on a measured property;
a controller configured to communicate with the sensor;
a communication channel electrically coupled to the sensor and the controller for carrying electrical communications therebetween, wherein the sensor includes a transmitter configured to transmit one or more electrical signals on the communication channel to the controller; and
a configurable load circuit coupled to the communication channel, wherein the configurable load circuit is configured to switchably apply a plurality of different loads to the communication channel during measurements of the one or more electrical signals to produce a plurality of actual signal function responses of the one or more electrical signals,
wherein the controller comprises a processing circuit configured to:
measure a first actual signal function response of the plurality of actual signal function responses,
correlate the first actual signal function response with a first reference signal function response correlated with a first load of the plurality of different loads to generate a first correlation value,
measure a second actual signal function response of the plurality of actual signal function responses,
correlate the second actual signal function response with a second reference signal function response correlated with a second load of the plurality of different loads to generate a second correlation value, and
detect a fault based on at least one of the first correlation value or the second correlation value satisfying a correlation threshold.

* * * * *